(12) United States Patent
Tanaka

(10) Patent No.: US 8,139,377 B2
(45) Date of Patent: Mar. 20, 2012

(54) IC DEVICE AND METHOD OF MANUFACTURING THE SAME

(75) Inventor: Naoya Tanaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/215,968

(22) Filed: Jul. 1, 2008

(65) Prior Publication Data

US 2009/0016040 A1 Jan. 15, 2009

(30) Foreign Application Priority Data

Jul. 10, 2007 (JP) ................................. 2007-181202

(51) Int. Cl.
 *H05K 7/00* (2006.01)
(52) U.S. Cl. ........................................ 361/820; 361/728
(58) Field of Classification Search .................. 361/820, 361/720, 748, 760, 715, 728, 730, 752, 796, 361/800; 257/767–778
See application file for complete search history.

(56) References Cited

U.S. PATENT DOCUMENTS

| | | | | |
|---|---|---|---|---|
| 3,501,582 A | * | 3/1970 | Heidler et al. | ................ 174/532 |
| 3,950,603 A | * | 4/1976 | Brefka | ........................... 174/544 |
| 4,336,417 A | * | 6/1982 | Hickling | .................... 174/138 F |
| 4,518,112 A | * | 5/1985 | Miller et al. | ................ 228/124.1 |
| 4,767,344 A | * | 8/1988 | Noschese | ........................ 439/83 |
| 4,838,089 A | * | 6/1989 | Okada et al. | ..................... 73/727 |
| 4,878,611 A | * | 11/1989 | LoVasco et al. | ......... 228/180.22 |
| 5,257,547 A | * | 11/1993 | Boyer | ............................. 73/756 |
| 5,616,863 A | * | 4/1997 | Koen | .............................. 73/493 |
| 5,684,675 A | * | 11/1997 | Taniguchi et al. | ............ 361/704 |
| 5,783,748 A | * | 7/1998 | Otani | .............................. 73/493 |
| 5,942,685 A | * | 8/1999 | Tabota | ........................... 73/493 |
| 6,031,710 A | * | 2/2000 | Wolf et al. | .................... 361/302 |
| 6,196,871 B1 | * | 3/2001 | Szu | .............................. 439/571 |
| 6,201,696 B1 | * | 3/2001 | Shimizu et al. | ............... 361/704 |
| 7,417,873 B2 | * | 8/2008 | Kadoya et al. | ................ 361/797 |
| 7,622,750 B2 | * | 11/2009 | Fujino et al. | ................... 257/99 |
| 7,671,382 B2 | * | 3/2010 | Sudo et al. | .................... 257/181 |

FOREIGN PATENT DOCUMENTS

| | | |
|---|---|---|
| JP | 1-112758 | 5/1989 |
| JP | 7-183626 | 7/1995 |

\* cited by examiner

*Primary Examiner* — Hung S Bui
(74) *Attorney, Agent, or Firm* — Hamre, Schumann, Mueller & Larson, P.C.

(57) ABSTRACT

An IC device includes a base plate, a plurality of terminal pins, a functional component such as an IC chip, and a resin package for protection of the functional component. The base plate is generally flat and formed with a plurality of through-holes into which the terminal pins are inserted. The functional component, disposed away from the base plate, is mounted on a printed circuit board to be electrically connected to at least one of the terminal pins. While enclosing the functional component, the resin package is held in contact with the upper surface of the base plate.

11 Claims, 9 Drawing Sheets

IC DEVICE AND METHOD OF MANUFACTURING THE SAME

BACKGROUND OF THE INVENTION

1. Field of the Invention

The present invention relates to an integrated circuit device (IC device) with a resin package, and also to a method of manufacturing such an IC device.

2. Description of the Related Art

A conventional IC device is disclosed in Japanese Patent Laid-open H07-183626, for example. This IC device generally has a structure shown in FIG. 11. Specifically, the conventional IC device 90 includes a resin package 91, a circuit board 92, a functional component 93, and a plurality of terminal pins 94. The resin package 91 covers the entirety of the circuit board 92. The circuit board 92 electrically connects the functional component 93 to the terminal pins 94. The functional component 93 is, for example, an IC chip, a resistance, a diode, and so forth.

The resin package 91 is formed by resin molding as shown in FIG. 12. Specifically, the circuit board 92, the functional component 93, and the terminal pins 94 are enclosed collectively in a pair of molds 99A, 99B. Then a material resin is injected into the space defined by the molds 99A, 99B, and then allowed to harden.

FIG. 13 is a bottom view illustrating the resin molding process shown in FIG. 12. As seen from the figure, the pair of molds 99A, 99B need to have a geometrically complicated zigzag portion in order to accommodate the terminal pins 94 and also to provide the sealed space for forming the resin package 91.

Problems of the above prior art are as follows. First, a mold with a complicated shape is expensive. Second, when the number or location of the terminal pins is to be changed, a new mold needs to be prepared. Unfavorably, the cost and additional time required for preparing the new mold renders the IC device expensive.

SUMMARY OF THE INVENTION

The present invention has been proposed under the circumstances described above. It is therefore an object of the present invention to provide an inexpensive IC device by eliminating the need to employ a complicated mold.

According to a first aspect of the present invention, there is provided an IC device comprising: a flat base plate-formed with a plurality of through-holes; a plurality of terminal pins each inserted into a corresponding one of the plurality of through-holes; a functional component spaced away from the base plate and electrically connected to at least one of the plurality of terminal pins; and a resin package enclosing the functional component and held in contact with a surface of the base plate.

The base plate thus configured simplifies the shape of the molds used for forming the resin package. Accordingly, the cost for making the molds is reduced, which leads to a reduced cost of the IC device.

Preferably, the terminal pins may be press-inserted into the through-holes, and the resin package may be made of a thermoplastic resin.

Preferably, the plurality of through-holes may be aligned in two rows.

Preferably, the IC device of the present invention may further comprise a circuit board for mounting the functional component.

Preferably, the circuit board is parallel to the base plate.

According to a second aspect of the present invention, there is provided a method of manufacturing an IC device. The method comprises the steps of: preparing a flat base plate formed with a plurality of through-holes; inserting terminal pins into the plurality of through-holes, respectively; electrically connecting a functional component to at least one of the plurality of terminal pins; forming a molding space by bringing a mold into contact with the base plate, where the molding space is defined by the mold and the base plate, and accommodates the functional component; and forming a resin package by supplying a molten resin into the molding space.

DETAILED DESCRIPTION OF THE PREFERRED EMBODIMENTS

Figure 1:
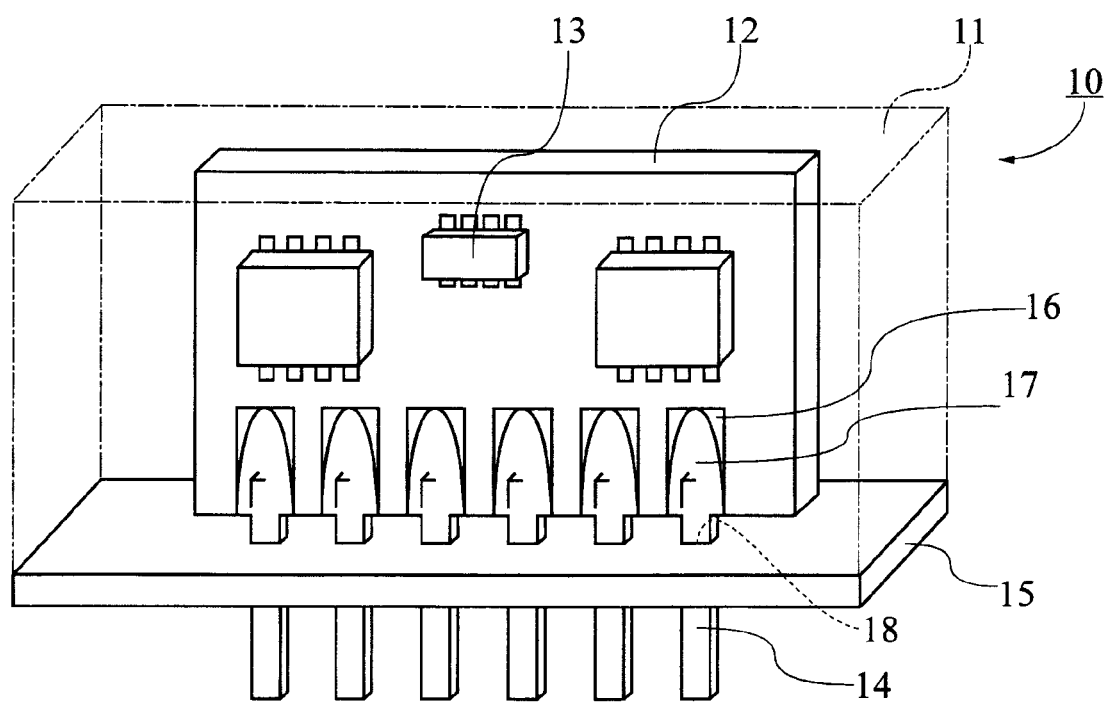
FIG. 1 is a perspective view showing an IC device according to a first embodiment of the present invention.

FIGS. 1 to 4 illustrate a first embodiment of the present invention. As shown in FIG. 1, an IC device 10 of the present invention includes a resin package 11, a printed circuit board 12, a functional component 13, and a plurality of terminal pins 14. The resin package 11 encloses the circuit board 12 and the functional component 13 mounted on the circuit board 12. The circuit board 12 is provided with a wiring pattern (not shown) and a plurality of pads 16 connected to the wiring pattern. The terminal pins 14 are connected to the pads 16, respectively, via solder 17. The functional component 13 is connected to selected ones of the pads 16 (and hence the terminal pins 14) via the unillustrated wiring pattern. The functional component 13 is, for example, an IC chip, a resistance, a diode, and so forth.

The IC device 10 also includes a base plate 15 made of an insulating material such as glass epoxy resin. The base plate 15 has upper and lower surfaces both of which are flat and rectangular. The base plate 15 is formed with a plurality of through-holes 18 each extending through the base plate 15 in a thickness direction of the plate (i.e., the direction in which the upper and lower surfaces are spaced from each other). Each of the terminal pins 14 is press-fitted into a corresponding one of the terminal pins 14. The through-holes 18 are small enough to firmly retain the inserted terminal pins 14. The upper surface of the base plate 15 is held in direct contact with the resin package 11. As seen from FIG. 1, the resin package 11 is in the form of a rectangular parallelepiped, and its bottom surface is generally the same in area as the upper surface of the base plate 15.

Figure 2:
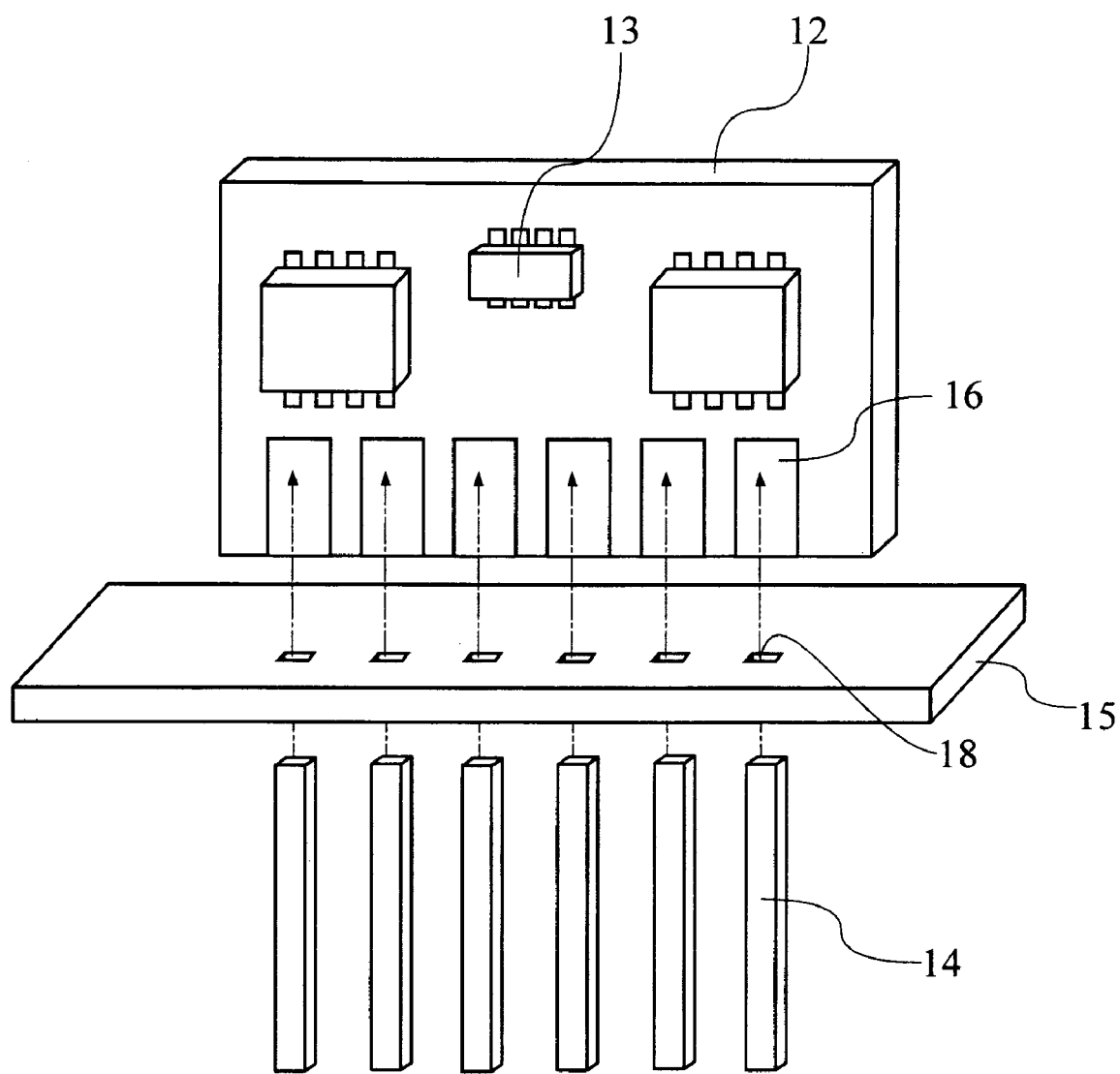
FIG. 2 is a perspective view showing a step of the manufacturing process.

FIG. 2 depicts a first stage of the manufacturing-process of the IC device 10. Specifically, the functional component 13 is mounted on the circuit board 12, while the terminal pins 14 are inserted into the through-holes 18 of the base plate 15, respectively. The through-holes 18 are small enough, as noted above, so that the terminal pins 14 are brought into close contact with the base plate 15 to be firmly retained. The terminal pins 14 are soldered, at their upper ends, to the pads 16, respectively.

Figure 3:
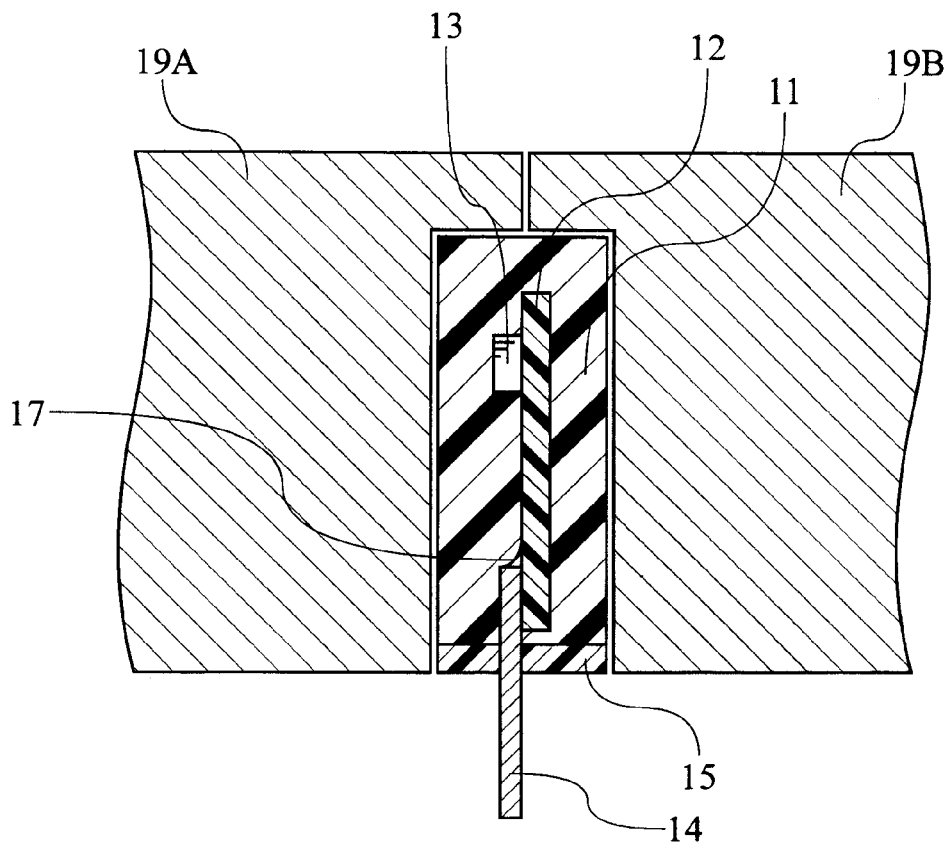
FIG. 3 is a cross-sectional view showing another step of the manufacturing process.

FIG. 3 depicts a second stage of the manufacturing process. The cooperative two molds 19A, 19B are pressed against each other to form a molding space therebetween. The bottom opening of the molding space is closed by the base plate 15. The left mold 19A is brought into close contact with the left side of the plate 15, while the right mold 19B is brought into close contact with the right side of the plate 15. The molding space thus sealed accommodates the circuit board 12, the functional component 13, and the inserted portion of each terminal pin 14.

Then, a material molten resin is supplied into the molding space for forming the resin package 11. The resulting resin package 11 is to enclose the circuit board 12, the functional component 13, and the inserted portions of the respective terminal pins 14, while also covering the upper surface of the base plate 15. As seen from FIG. 3, the right and left side surfaces of the resin package 11 are flush with the right and left side surfaces of the base plate 15, respectively.

For the material resin to make the package 11, a thermoplastic resin may be preferably used, though the present invention is not limited to this. A thermoplastic resin requires lower pressure in being introduced into the molding space than a thermosetting resin. The use of such lower pressure prevents the material resin from leaking through a gap that may be present between the inner walls of the respective through-holes 18 and the terminal pins 14. The lower pressure is also advantageous in preventing the terminal pins 14 from being pushed out of the through-holes 18.

Figure 4:
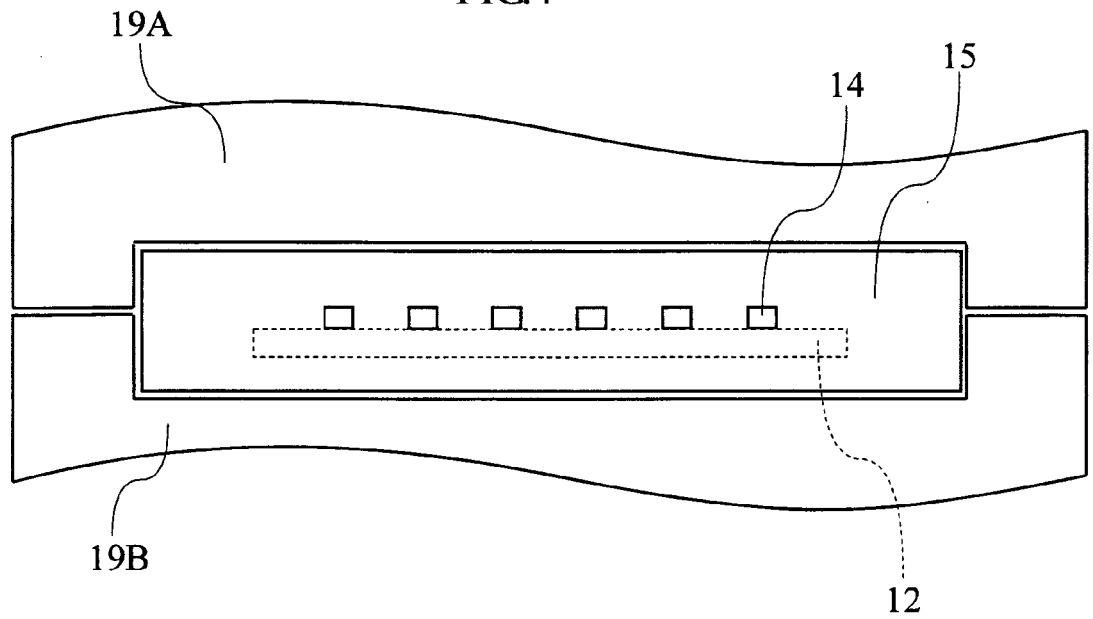
FIG. 4 is a bottom view showing the arrangement of the elements assembled as shown in FIG. 3.
Figure 13:
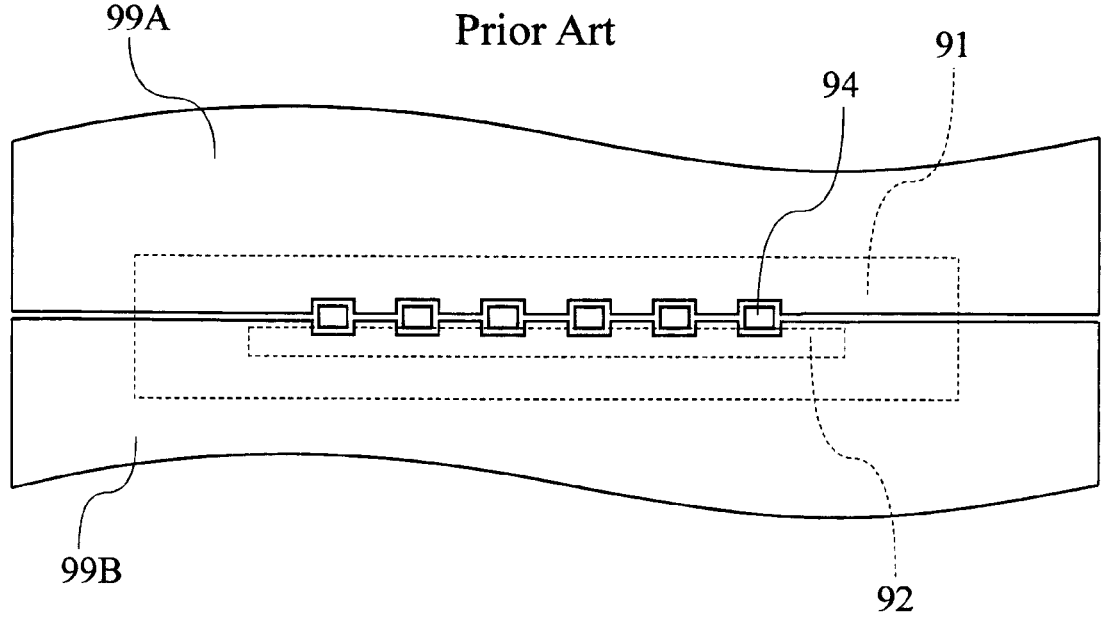
FIG. 13 is a bottom view showing the arrangement of the elements assembled as shown in FIG. 12.

FIG. 4 is a bottom view showing the assembled elements of FIG. 3. Differing from the conventional molds (FIG. 13), the molds 19A, 19B have a simple configuration, to be brought into contact with the rectangular perimeter of the base plate 15. Such a simple design allows the molds 19A, 19B to be made at low cost. Further, when a design modification is made on the circuit to be included in the IC device 10, the same pair of molds 19A, 19B can be used for the new design. This is because the modification in number or location of the terminal pins 14 can be achieved by modifying the arrangement of the through-holes 18 in the base plate 15, whereby there is no need to modify the shape of the molds 19A, 19B.

Figure 5:
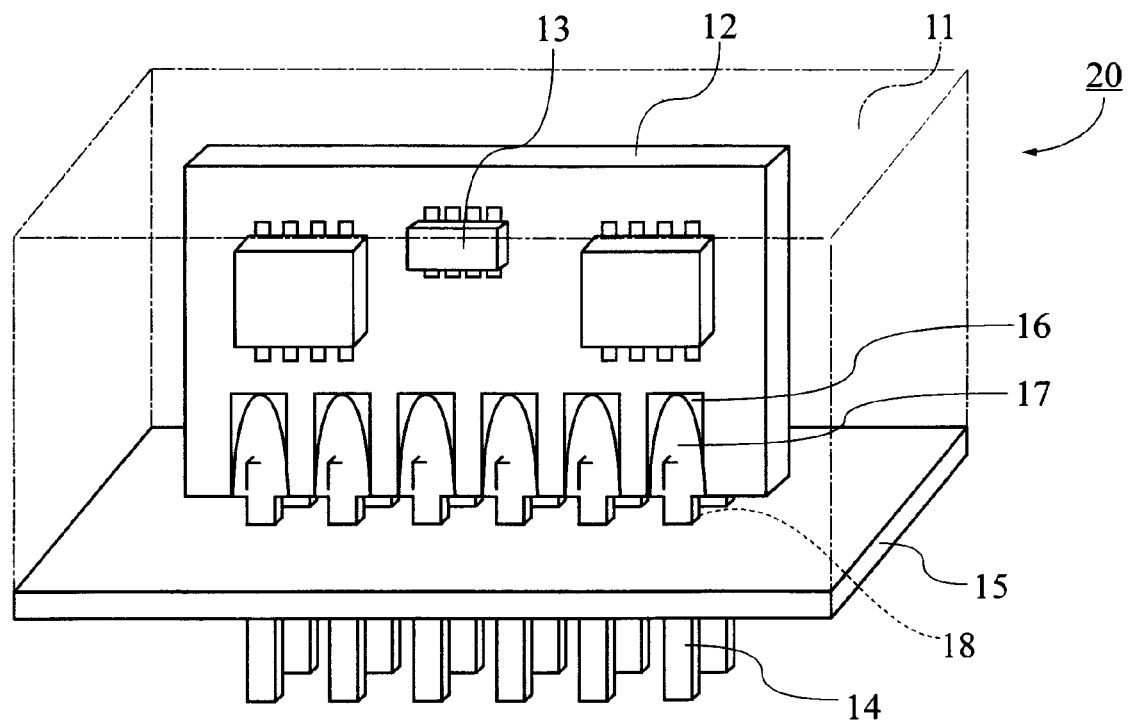
FIG. 5 is a perspective view showing an IC device according to a second embodiment of the present invention.
Figure 6:
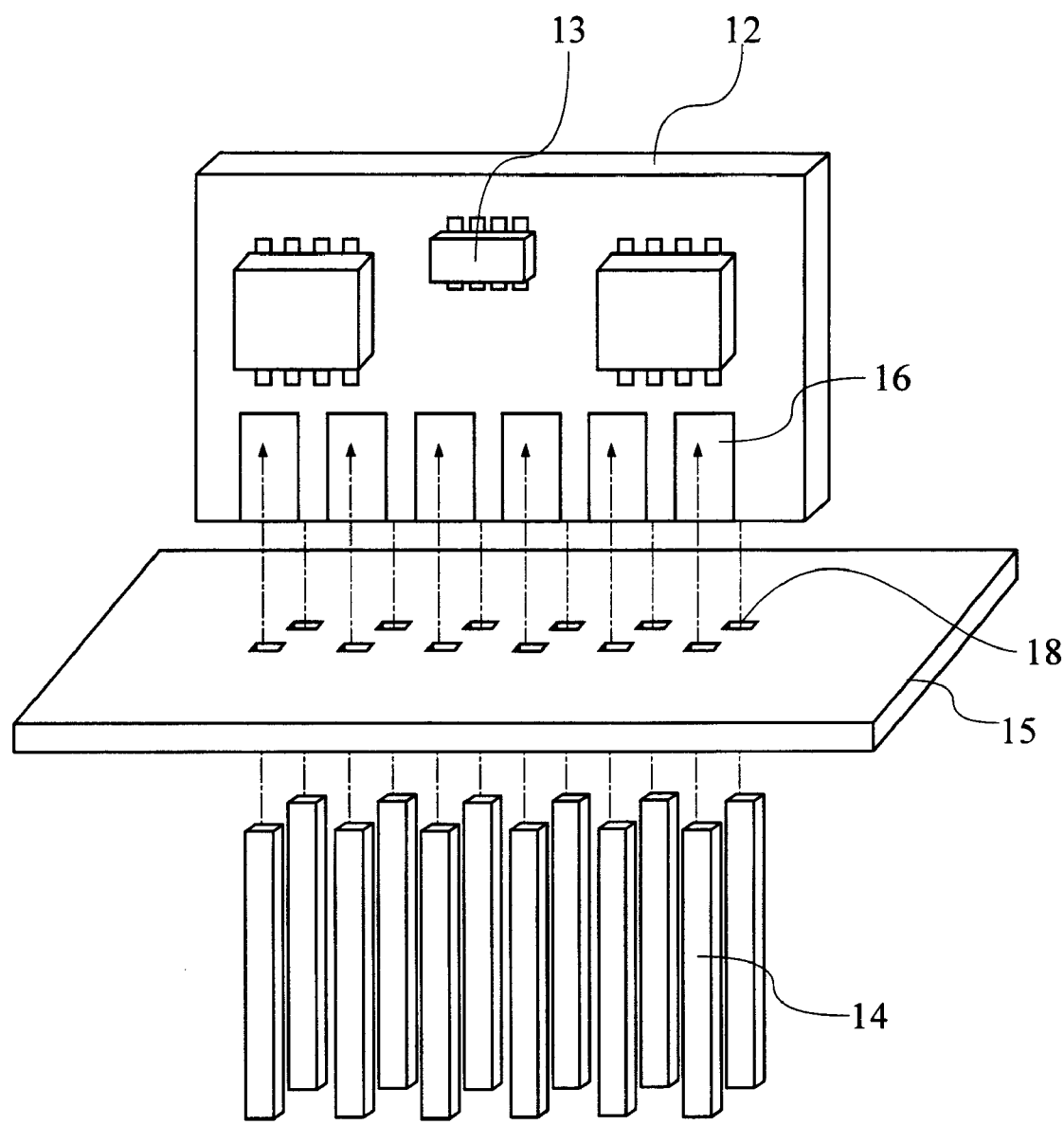
FIG. 6 is a perspective view showing a step of the manufacturing process of the IC device according to the second embodiment.
Figure 7:
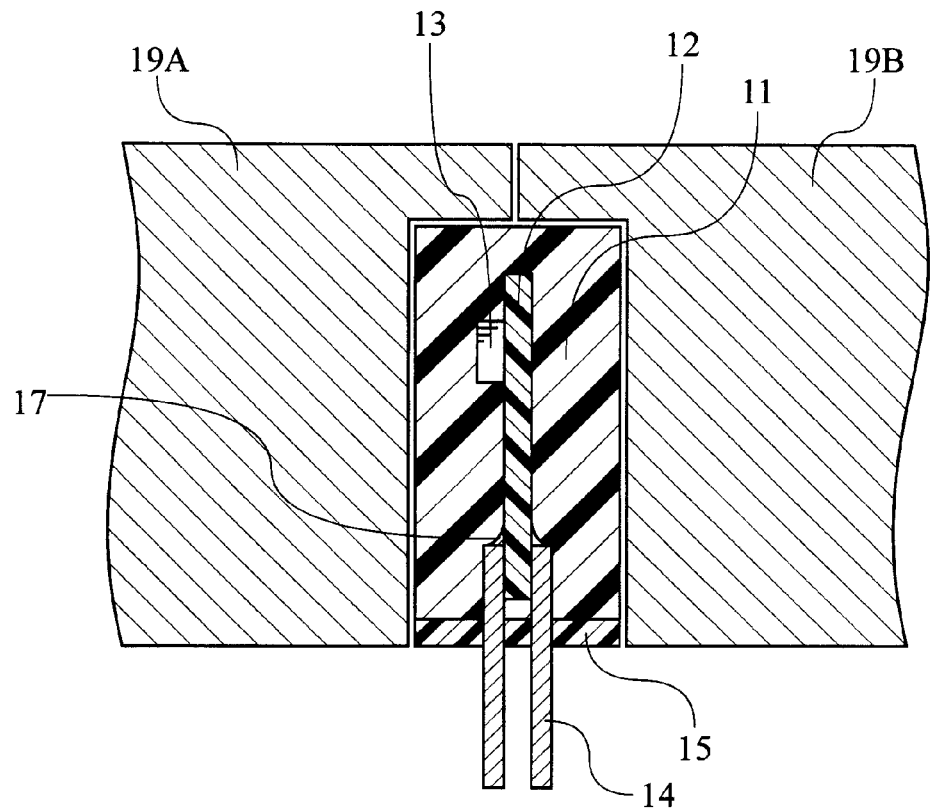
FIG. 7 is a cross-sectional view showing another step of the manufacturing process of the IC device according to the second embodiment.

Referring now to FIGS. 5 to 7, a second embodiment of the present invention will be described. As seen from FIG. 5, the second embodiment differs from the first embodiment in that the IC device 20 has terminal pins 14 arranged in two rows. The constituents in this embodiment that are identical or similar to those of the foregoing embodiment are designated by the same reference numeral, and the description thereof will be omitted.

FIG. 6 depicts a first stage of the manufacturing process of the IC device 20. The base plate 15 includes the plurality of through-holes 18 aligned in two rows. Each of the terminal pins 14 is inserted into a corresponding one of the through-holes 18. The inserted terminal pins 14 are held in close contact with the base plate 15 to be retained firmly. The distance between one row and the other of the terminal pins 14 is made large enough to accommodate the thickness of the circuit board 12 and to permit all the terminal pins 14 to be connected to the corresponding pads 16, respectively.

FIG. 7 depicts a second stage of the manufacturing process. The two molds 19A, 19B employed to form the resin package 11 are brought into contact with the base plate 15. In the second embodiment again, the molds 19A, 19B are of a simple shape, and can be used for making IC devices having different layouts of the terminal pins 14.

Figure 8:
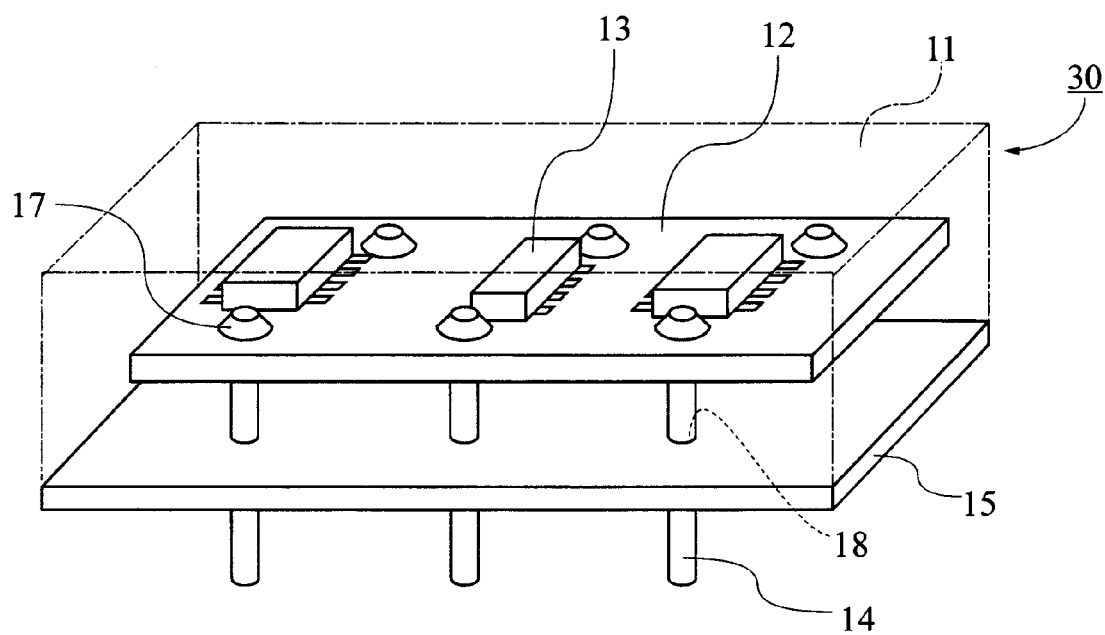
FIG. 8 is a perspective view showing an IC device according to a third embodiment of the present invention.
Figure 9:
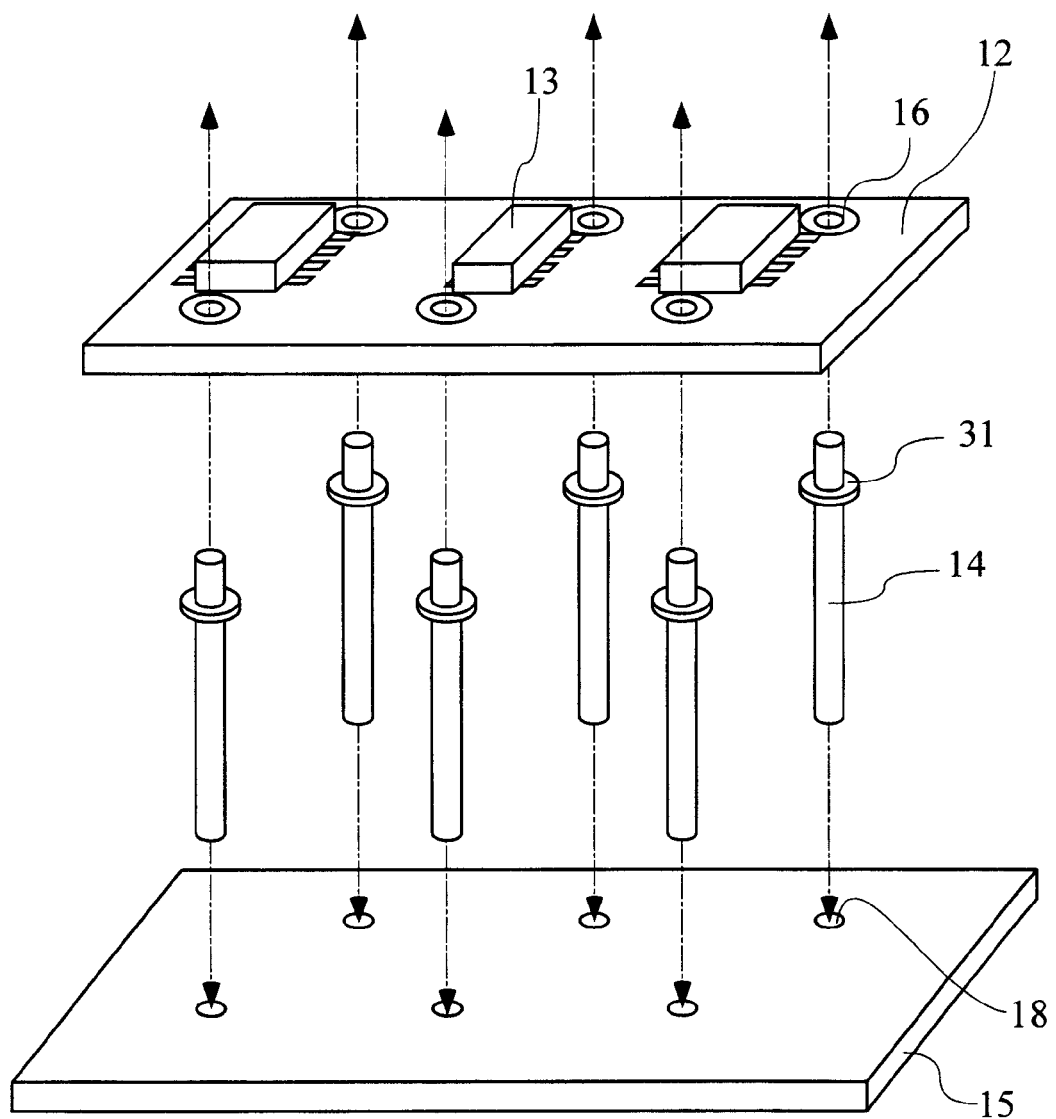
FIG. 9 is a perspective view showing a step of the manufacturing process of the IC device according to the third embodiment.
Figure 10:
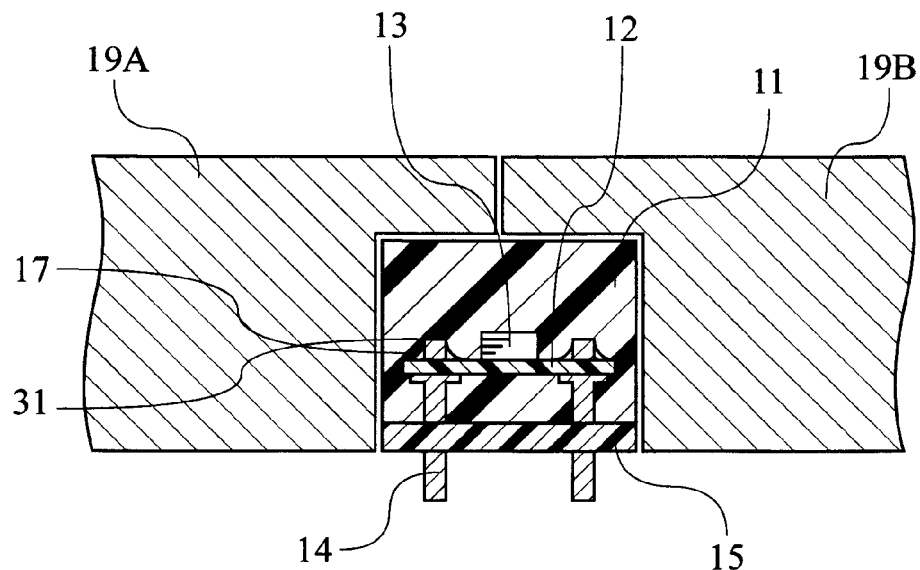
FIG. 10 is a cross-sectional view showing another step of the manufacturing process of the IC device according to the third embodiment.
Figure 11:
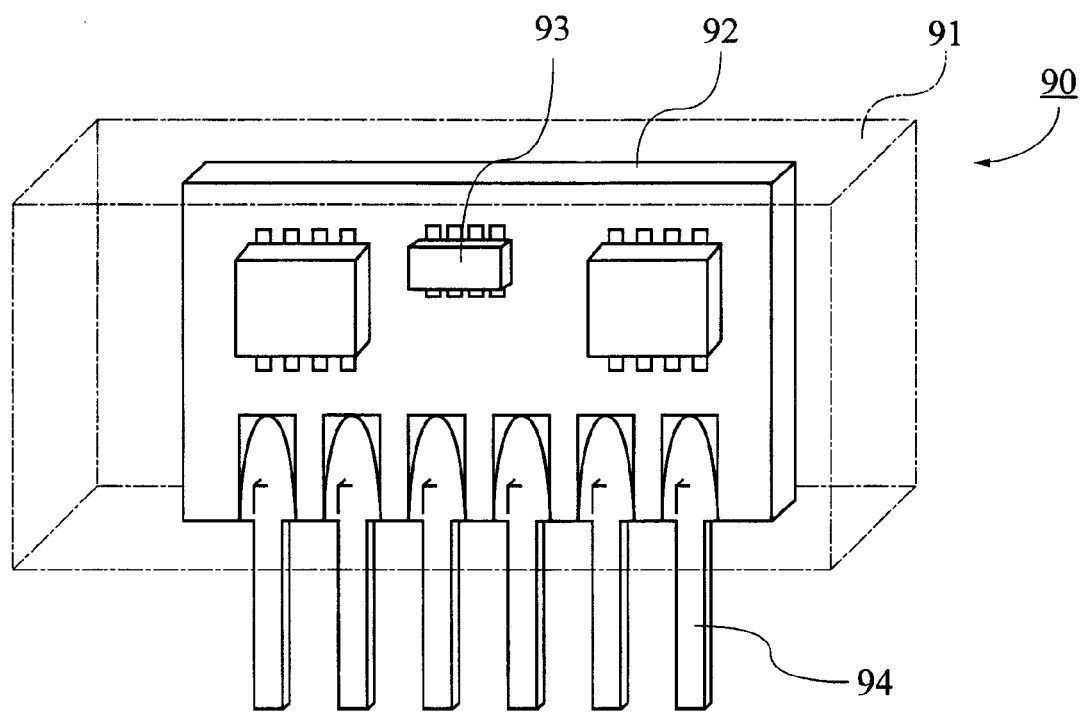
FIG. 11 is a perspective view showing a conventional IC device.
Figure 12:
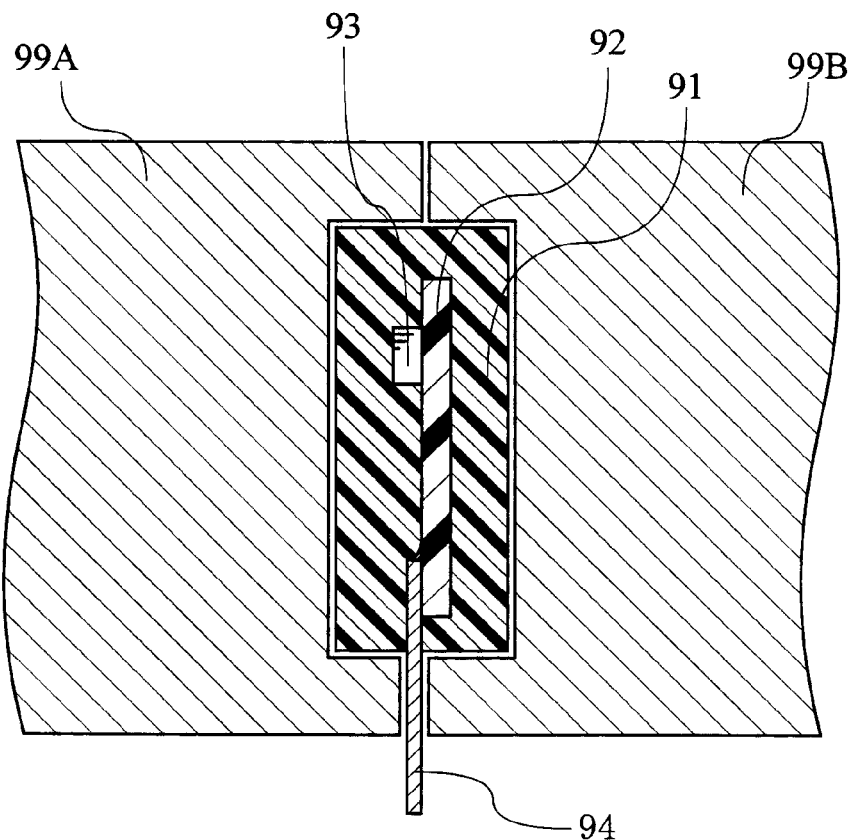
FIG. 12 is a cross-sectional view showing a step of the manufacturing process of the conventional IC device.

FIGS. 8 to 10 illustrate a third embodiment of the present invention. As seen from FIG. 8, an IC device 30 of this embodiment is different from those of the foregoing-embodiments in that the circuit board 12 is oriented in parallel to the base plate 15. The constituents of the third embodiment that are identical or similar to those of the foregoing embodiments are designated by the same reference numeral, and the description thereof will be omitted.

FIG. 9 depicts a first stage of the manufacturing process of the IC device 30. The terminal pins 14 each include a flange 31. The flange 31 serves to support the circuit board 12 from below. The circuit board 12 includes a plurality of pads 16 each formed with a through-hole. An end portion of the terminal pins 14 is inserted through the through-hole of the pad 16, and electrically connected to the pad 16 via solder 17.

FIG. 10 depicts a second stage of the manufacturing process. The two molds 19A, 19B employed to form the resin package 11 are brought into contact with the base plate 15. In this embodiment again, the molds 19A, 19B are of a simple shape, and can be used for an IC device having different layouts of the terminal pins 14.

It should be appreciated that the present invention is not limited to the embodiments described above. For instance, the IC device may include more than one circuit board. The terminal pins may have a clip connector for enabling solderless connection to the circuit board. The terminal pins may have a bent end for surface-mounting on another circuit board. The circuit board may be a conductor of a different type from a printed circuit board, or even replaced by a lead frame, for example. The functional component may be directly soldered to the terminal pins for electrical connection without using a wiring pattern formed on the circuit board. In the molding process of the resin package, the molds may be pressed against portions other than the side surfaces of the base plate. For example, the molds may come into contact with the upper surface of the base plate.

The invention claimed is:

1. An IC device comprising:
   a flat base plate including a first main surface, a second main surface opposite to the first main surface, and an outer side surface between the first and second main surfaces, the base plate being formed with a plurality of through-holes;
   a plurality of terminal pins each inserted into a corresponding one of the plurality of through-holes;
   a functional component spaced away from the base plate and electrically connected to at least one of the plurality of terminal pins; and
   a resin package enclosing the functional component and provided separately from the base plate in contact with the first main surface of the base plate over an entire area of the first main surface, the resin package including an outer side surface that is flush with the outer side surface of the base plate.

2. The IC device according to claim 1, wherein the terminal pins are press-inserted into the through-holes, and the resin package is made of a thermoplastic resin.

3. The IC device according to claim 1, wherein the plurality of through-holes are aligned in two rows.

4. The IC device according to claim 1, further comprising a circuit board for mounting the functional component.

5. The IC device according to claim 4, wherein the circuit board is parallel to the base plate.

6. A method of manufacturing an IC device, the method comprising:
  preparing a flat base plate made of an insulating material and formed with a plurality of through-holes;
  inserting terminal pins into the plurality of through-holes, respectively;
  electrically connecting a functional component to at least one of the plurality of terminal pins;
  forming a molding space by bringing a mold into contact with the base plate, the molding space being defined by the mold and the base plate, the molding space accommodating the functional component and having an opening closed by the base plate; and
  forming a resin package by supplying a molten resin into the molding space, the molten resin being different from the insulating material of the base plate.

7. The method according to claim 6, wherein the base plate has side surfaces, the mold coming into contact with the side surfaces of the base plate for closing the molding space.

8. An IC device comprising:
  a flat base plate made of an insulating material, the base plate including a first main surface, a second main surface opposite to the first main surface, and outer side surfaces between the first and second main surfaces, the base plate being formed with a plurality of through-holes;
  a plurality of terminal pins each inserted into a corresponding one of the plurality of through-holes;
  a circuit board connected to the plurality of terminal pins;
  a functional component mounted on the circuit board and spaced away from the base plate, the functional component being electrically connected to at least one of the plurality of terminal pins; and
  a resin package made of a resin material different from the insulating material of the base plate, the resin package enclosing the functional component and held in contact with the first main surface of the base plate, the resin package including outer side surfaces flush with the outer side surfaces of the base plate.

9. The IC device according to claim 8, wherein the circuit board is perpendicular to the first main surface of the base plate.

10. The IC device according to claim 8, wherein the circuit board is parallel to the first main surface of the base plate.

11. The IC device according to claim 8, wherein part of the resin package fills a clearance between the circuit board and the base plate.

* * * * *